(12) United States Patent
Grupen-Shemansky

(10) Patent No.: US 7,901,955 B2
(45) Date of Patent: Mar. 8, 2011

(54) METHOD OF CONSTRUCTING A STACKED-DIE SEMICONDUCTOR STRUCTURE

(75) Inventor: Melissa Grupen-Shemansky, Los Gatos, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/821,653

(22) Filed: Jun. 25, 2007

(65) Prior Publication Data

US 2008/0318348 A1   Dec. 25, 2008

(51) Int. Cl.
*H01L 21/66* (2006.01)

(52) U.S. Cl. ...... 438/15; 438/108; 257/777; 257/E25.03; 257/E21.513; 257/E21.523

(58) Field of Classification Search .................... 438/15, 438/108; 257/777, E25.03, E21.513, E21.523
See application file for complete search history.

(56) References Cited

U.S. PATENT DOCUMENTS

| | | | | |
|---|---|---|---|---|
| 5,548,884 A * | 8/1996 | Kim | ................. | 29/593 |
| 5,644,247 A * | 7/1997 | Hyun et al. | ................. | 324/755 |
| 5,861,666 A * | 1/1999 | Bellaar | ................. | 257/686 |
| 5,925,934 A * | 7/1999 | Lim | ................. | 257/778 |
| 6,064,217 A * | 5/2000 | Smith | ................. | 324/760 |
| 6,245,586 B1 * | 6/2001 | Colvin | ................. | 438/15 |
| 6,249,136 B1 * | 6/2001 | Maley | ................. | 324/765 |
| 6,560,117 B2 * | 5/2003 | Moon | ................. | 361/749 |
| 6,586,266 B1 * | 7/2003 | Lin | ................. | 438/15 |
| 6,677,169 B1 * | 1/2004 | Li | ................. | 438/15 |
| 6,744,126 B1 * | 6/2004 | Chiang | ................. | 257/686 |
| 6,774,659 B1 * | 8/2004 | Chiang | ................. | 324/765 |
| 6,927,078 B2 * | 8/2005 | Saijyo et al. | ................. | 438/10 |
| 6,977,440 B2 * | 12/2005 | Pflughaupt et al. | ................. | 257/777 |
| 7,148,505 B1 * | 12/2006 | Kuang | ................. | 257/48 |
| 7,190,060 B1 * | 3/2007 | Chiang | ................. | 257/686 |
| 7,306,957 B2 * | 12/2007 | Wada et al. | ................. | 438/14 |
| 7,349,223 B2 * | 3/2008 | Haemer et al. | ................. | 361/767 |
| 7,364,946 B2 * | 4/2008 | Karnezos | ................. | 438/109 |
| 7,429,787 B2 * | 9/2008 | Karnezos et al. | ................. | 257/686 |
| 7,517,726 B1 * | 4/2009 | Tan et al. | ................. | 438/114 |
| 2001/0033010 A1 * | 10/2001 | Tanioka et al. | ................. | 257/675 |
| 2001/0038293 A1 * | 11/2001 | Fukuda et al. | ................. | 324/754 |
| 2001/0048591 A1 * | 12/2001 | Fjelstad et al. | ................. | 361/767 |
| 2002/0011651 A1 * | 1/2002 | Ichinose | ................. | 257/666 |
| 2002/0011859 A1 * | 1/2002 | Smith et al. | ................. | 324/755 |
| 2002/0043984 A1 * | 4/2002 | Torreiter | ................. | 324/758 |
| 2003/0199119 A1 * | 10/2003 | Lin | ................. | 438/107 |
| 2004/0113254 A1 * | 6/2004 | Karnezos | ................. | 257/686 |
| 2004/0169276 A1 * | 9/2004 | Tan | ................. | 257/737 |
| 2005/0206401 A1 * | 9/2005 | Caldwell et al. | ................. | 324/757 |
| 2006/0033216 A1 * | 2/2006 | Pflughaupt et al. | ................. | 257/777 |
| 2006/0151875 A1 * | 7/2006 | Lin et al. | ................. | 257/713 |
| 2007/0176297 A1 * | 8/2007 | Zohni | ................. | 257/777 |
| 2007/0262436 A1 * | 11/2007 | Kweon et al. | ................. | 257/686 |
| 2008/0070330 A1 * | 3/2008 | Wada et al. | ................. | 438/15 |
| 2008/0135840 A1 * | 6/2008 | Peng et al. | ................. | 257/48 |

\* cited by examiner

*Primary Examiner* — George Fourson

(57) ABSTRACT

In constructing a multi-die semiconductor device, a plurality of semiconductor die are provided. Each die is probe tested when it is part of a wafer. Flat contacts are connected to each die when it is part of a wafer. After wafer sawing, each die is tested in a test socket, using the contacts connected thereto. The die are then packaged in stacked relation to form the multi-die semiconductor device.

14 Claims, 7 Drawing Sheets

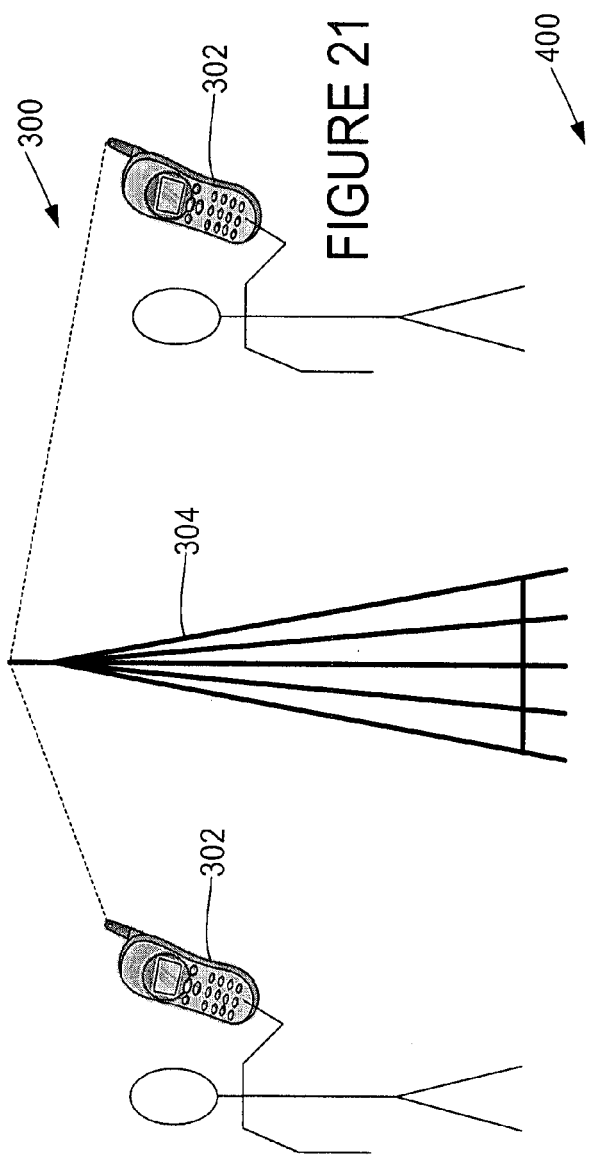
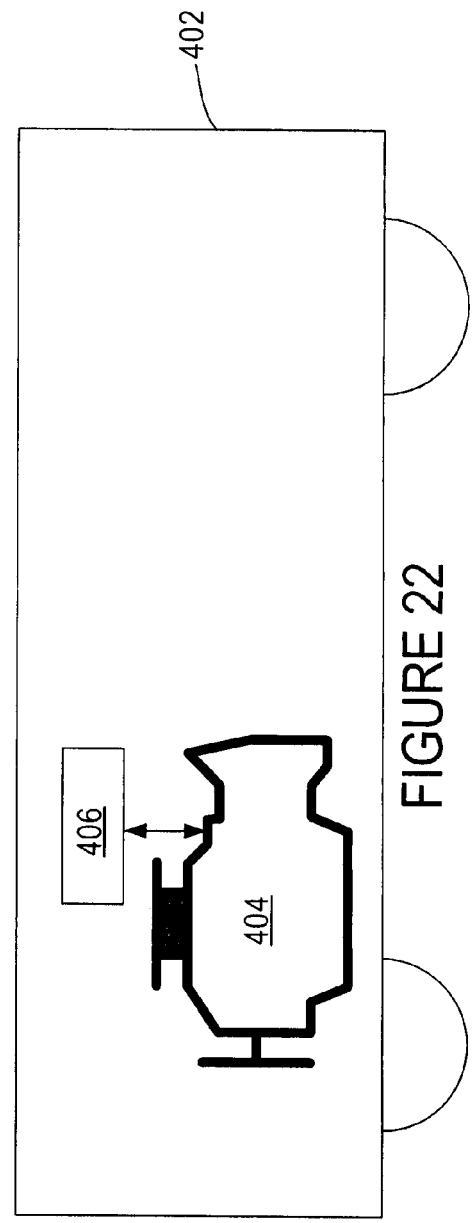

METHOD OF CONSTRUCTING A STACKED-DIE SEMICONDUCTOR STRUCTURE

BACKGROUND OF THE INVENTION

1. Technical Field

This invention relates generally to semiconductor devices which include a plurality of stacked semiconductor die, and more particularly, to a method of constructing such a device with improved yield.

2. Background Art

Shown in FIG. 1 is a semiconductor device 20. This semiconductor device 20 is of a ball grid array (BGA) configuration which will now be described. As shown in FIG. 1, a carrier substrate 22 has a chip attach surface 24. A silicon chip or die 26 is attached to the surface 24 of the substrate 22 by a die bond 28. A plurality of solder balls 30 are attached to the substrate 22 on the side thereof opposite the die 26. The semiconductor die 26 is electrically connected to the plurality of solder balls 30 by wires 32 connecting the die 26 to traces and vias 34 through the substrate 32, which vias 34 connect to the solder balls 30. A molded package body 36 is formed over the resulting structure as shown, enclosing the die 26 and wires 32

As is well known, with the die 26 as part of a wafer, the die 26 (and the other die of the wafer) is tested by means of probes for some functions of the die 26. While such a wafer probe test with the die 26 as part of a wafer is not a complete test of all the functions of the die, it is helpful in eliminating die which prove defective in such a probe a test.

The wafer is then sawed into individual die, as is well known, and each die which has successfully been probe tested is then packaged in the manner shown in FIG. 1. The completed semiconductor device 20 is placed into a test socket 36 of a test device 38 and is clamped therein, so that the solders balls 30 are brought into contact with test probes 40 of the test socket 36. Complete functional testing is then undertaken on the die 26 of the device 20, and failed devices are eliminated.

FIG. 2 illustrates a multi-die semiconductor device 40, with the die in stacked relation. As shown in FIG. 2, a carrier substrate 42 has a chip attach surface 44. A silicon chip or die 46 is attached to the surface 44 of the substrate 42 by a die bond 48. A silicon die 50 is attached to the die 46 in stacked relation by a die bond 52. A silicon die 54 is attached to the die 50 in stacked relation by a die bond 56. A plurality of solder balls 58 are attached to the substrate 42 on the side thereof opposite the die 46. The semiconductor die 46, 50, 54 are electrically connected to the plurality of solder balls 58 by wires 60 connecting the die 46, 50, 54 to traces and vias 62 through the substrate 42, which vias 62 connect to the solder balls 58. A molded package body 64 is formed over the resulting structure as shown, enclosing the die 46, 50, 54 and wires 60.

With each die as part of a wafer, the die (and the other die of the wafer) is tested by means of probes for some functions of the die, as described above. Again, while such a probe test with the die as part of a wafer is not a complete test of all the functions of the die, it is helpful in eliminating die which have proven defective in such a wafer probe test.

Assuming all three die 46, 50, 54 to be packaged together as shown in FIG. 2 pass the wafer probe test, they are packaged as described above to provide the device 40.

The completed semiconductor device 40 is placed in a test socket 66 of a test device 68 and clamped therein, so that the solders balls 58 are brought into contact with test probes 70 of the test socket 66. Complete functional testing is then undertaken on the device 40, and failed devices are eliminated.

As noted above, a number of die which pass the wafer probe test may actually be faulty and would fail a more thorough test undertaken in a test socket. However, the die 46, 50, 54 of the device 40 are not so individually tested but rather, the overall functioning of the device 40 including die 46, 50, 54 is tested, and the device 40 is eliminated if it fails such test. The failure may be due to the failure of one of the die 46, 50, 54, with the other two die being properly functional, however the overall failure of the device 40 means that the device 40 is discarded even though two of the die may be properly functional. It should also be realized that the problem is increased with the number of the die in a package, since, due to the increased number of die in the package, there is an increased chance of including in the device a die that, while passing the wafer probe test, would actually fail more complete testing, causing the entire device to be eliminated.

Therefore, what is needed is a way to improve the yield of devices which include multiple semiconductor die.

DISCLOSURE OF THE INVENTION

Broadly stated, a method of constructing a multi-die semiconductor device is provided, the method comprising providing a first semiconductor die, providing contacts connected to the first semiconductor die, testing the first semiconductor die in a test socket, using the contacts connected to the first semiconductor die, and providing the first semiconductor die in a package including at least a second semiconductor die in stacked relation with the first semiconductor die.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIGS. 21-23 illustrate systems for using the devices produced in accordance with the present methods.

BEST MODE(S) FOR CARRYING OUT THE INVENTION

Reference is now made in detail to specific embodiments of the present invention which illustrate the best mode presently contemplated by the inventors for practicing the invention.

Figure 1:
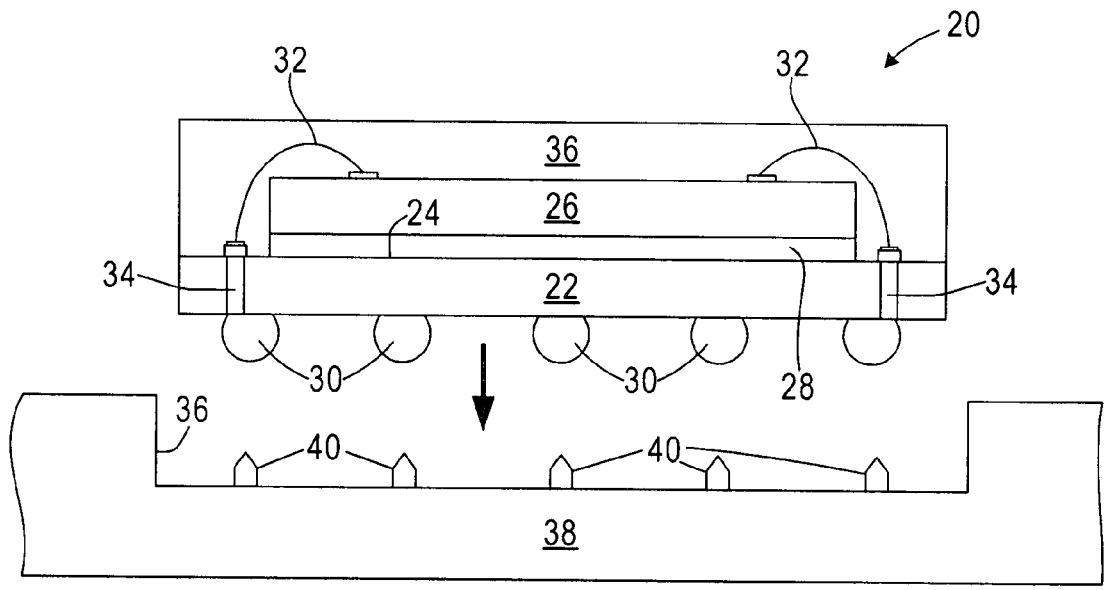
FIG. 1 illustrates conventional socket testing of a single-die semiconductor device.
Figure 2:
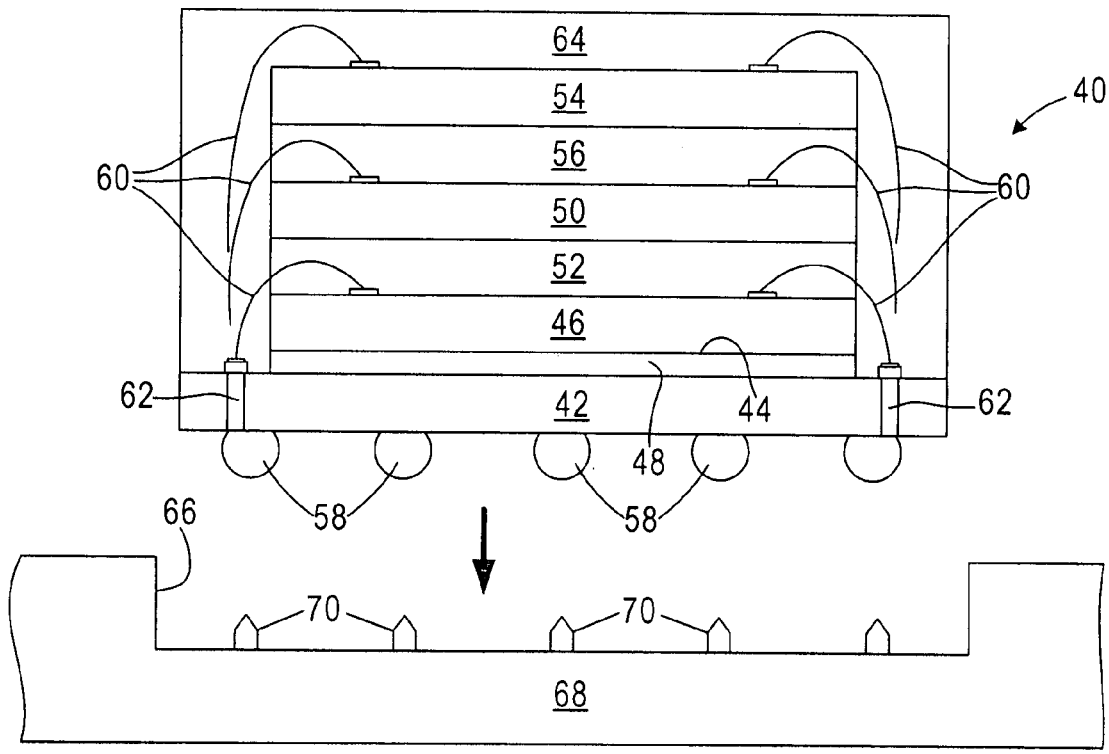
FIG. 2 illustrates conventional socket testing of a stacked-die semiconductor device
Figure 3:
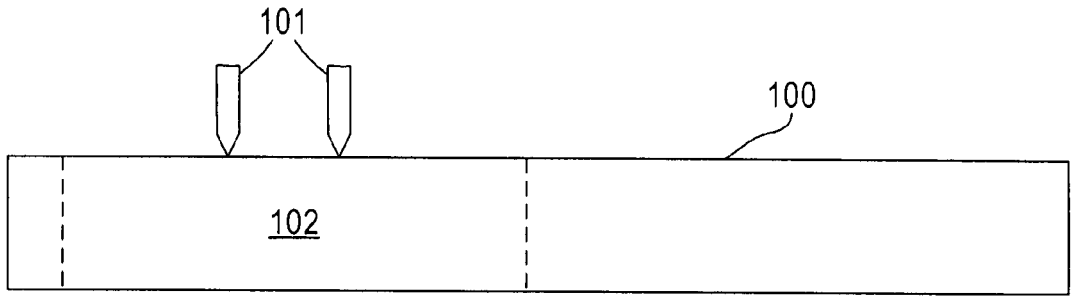
FIGS. 3-11 illustrate a first embodiment for practicing the invention.

FIG. 3 illustrates a semiconductor wafer 100 which includes a number of individual semiconductor die. The wafer 100 has been processed to provide circuitry, for example, memory circuitry, as part of each die. Wafer probe testing (probes 101) is undertaken on each die (one shown at 102), with the die as part of the wafer. The wafer probe testing of each die, while not a complete functional test, provides for elimination of die which do not pass these tests. The die which fail these tests are appropriately marked as is well known so that they can be discarded in the future.

Figure 4:
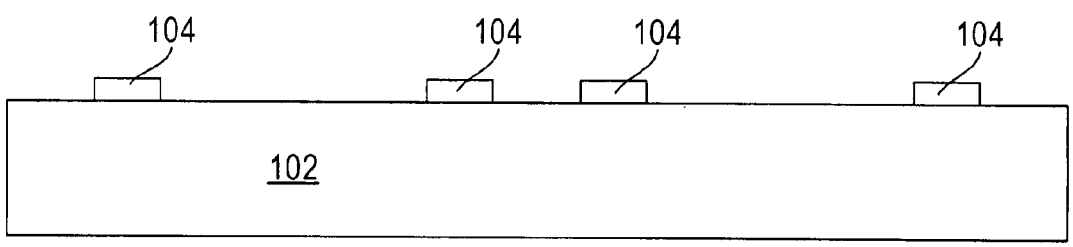
Figure 5:
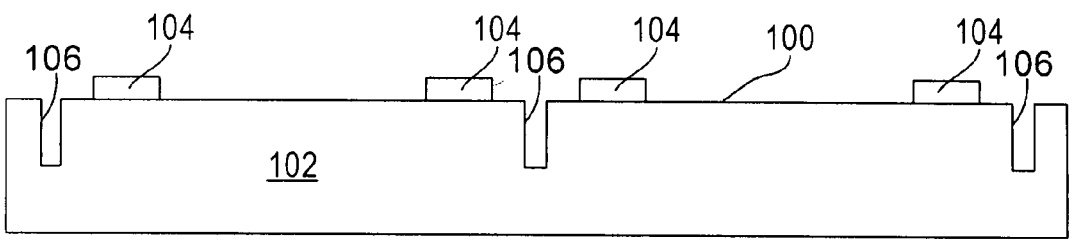
Figure 6:
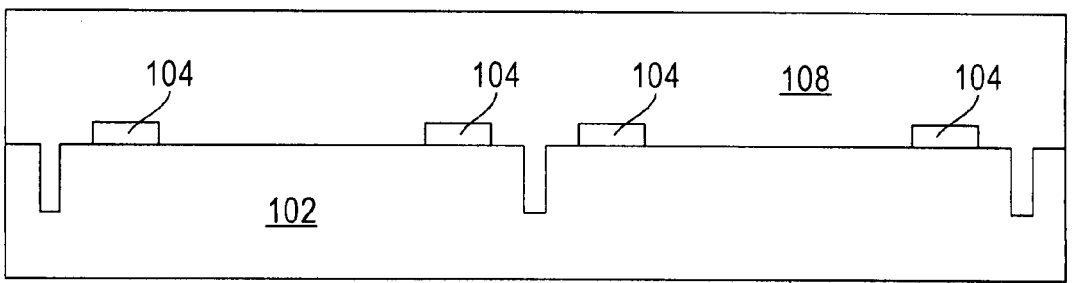
Figure 7:
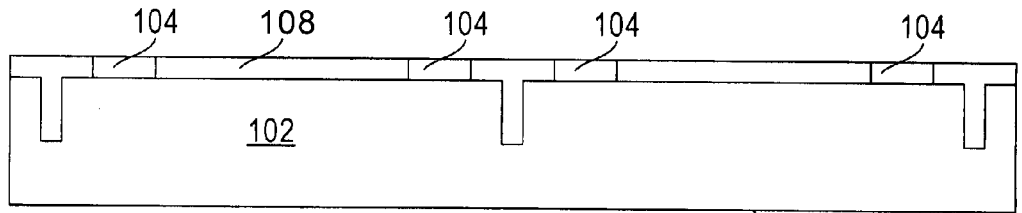
Figure 8:
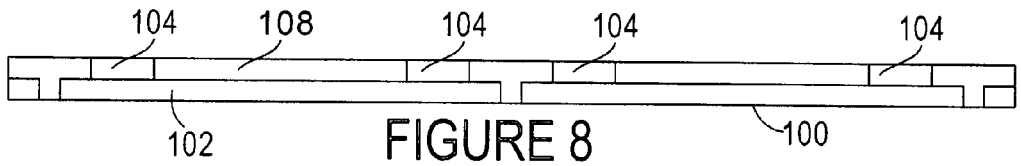
Figure 9:
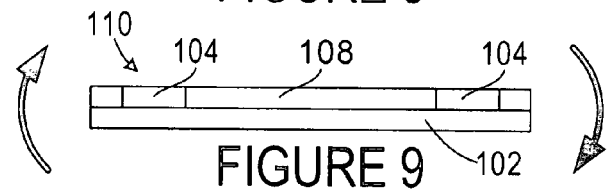

With the die still in wafer form, substantially flat metal contacts 104 are formed by means of plating on the die of the wafer 100 for functional contact with the circuitry of each die (FIG. 4). These contacts 104 may for example be gold or copper. Cuts 106 are made partially through the wafer 100 about the periphery of each die (FIG. 5), with the die remaining as part of the wafer 100. Next, liquid mold compound is provided over the entire structure (FIG. 6), and for example a vacuum dipping compression molding method is used to form mold compound 108, extending into the cuts. The top surface of the mold compound 108 it is then ground down to expose the contacts 104 (FIG. 7). The bottom of the wafer 100 is then ground down until the wafer 100 is thinned to a desired final thickness (FIG. 8). The wafer 100 is then sawed into individual units, each including a die (one unit 110 including die 102 shown in FIG. 9). The units which include die that failed the wafer probe test are discarded.

Figure 10:
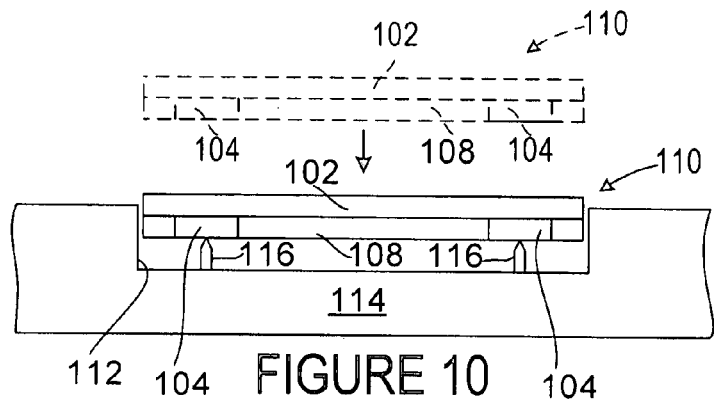

The unit 110 including the individual, unenclosed die 102 is flipped over (FIG. 9), so that the contacts 104 are now are downwardly positioned. The unit 110 can then be placed into the test socket 112 of a testing device 114, and clamped down therein, with the contacts 104 in direct contact with test probes 116 in the test socket 112 of the testing device 114 (FIG. 10). Full functional testing can then be done on the unenclosed die 102 with the unit 110 inserted in the test socket 112, a much more complete form of testing, for example testing at high sped speed under higher and lower temperatures, than the probe testing of the die 102 undertaken with the die 102 as part of the wafer 100.

Figure 11:
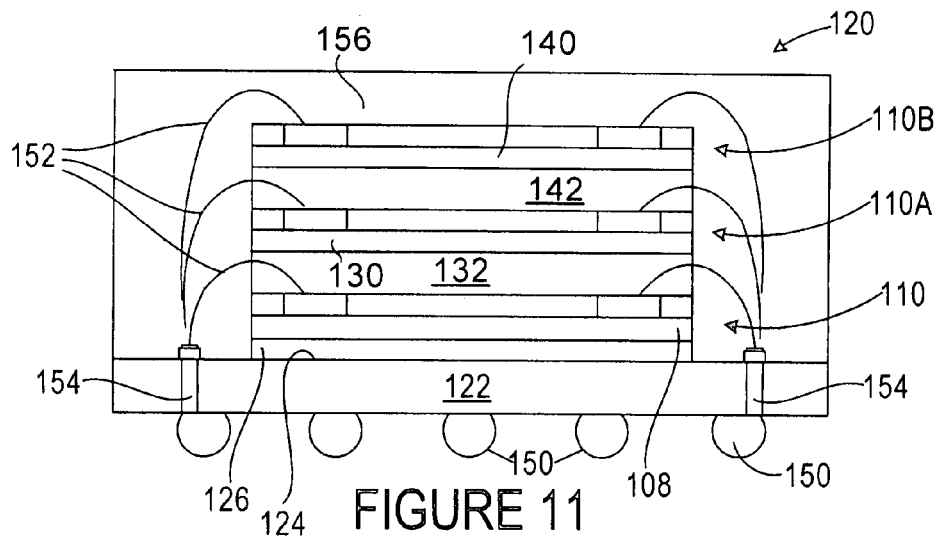

This process is undertaken on units which include other individual, unenclosed die, from the same or other wafers. The die which do not pass this full functional testing are discarded, leaving only die which have passed the full functional testing undertaken thereon in the test socket 112. Units including various die are provided in stacked relation to become part of a multi-die semiconductor device 120. As shown in FIG. 11, a carrier substrate 122 has chip attach surface 124. A unit 110 including die 102 is attached to the surface 124 of the substrate 122 by a die bond 128. A unit 110A including die 130 is attached to the unit 110 in stacked relation by a die bond 130. A unit 110B including die 140 is attached to the unit in stacked relation by a die bond 142. A plurality of solder balls 150 are attached to the substrate 122 on the side thereof opposite the die 102. The semiconductor die 102, 130, 140 are electrically connected to the plurality of solder balls 150 by wires 152 connecting the die 102, 130, 140 to traces and vias 154 through the substrate 122, which vias 154 connect to the solder balls 150. A molded package body 156 is formed over the resulting structure as shown, enclosing the die 102, 130, 140 and wires 152.

Socket testing each of the unenclosed die which go into the completed multi-die semiconductor device 120, and eliminating those die which fail such socket testing, greatly increases the likelihood that the completed multi-die semiconductor device will pass final test. The process described in relation to FIGS. 4-9 prepares these unenclosed die in a manner which enables that they can be so socket tested, which testing could not be undertaken on individual die. The problem of low yield of completed devices based on failure of a single die thereof is thereby overcome.

Figure 12:
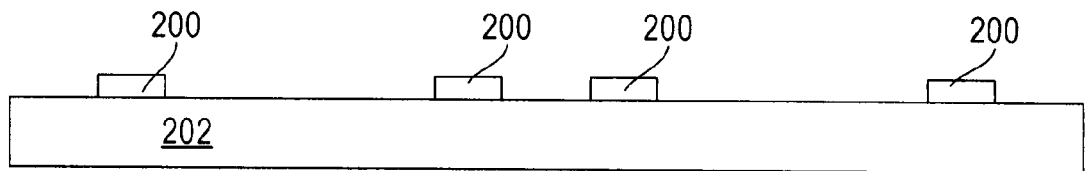
FIGS. 12-20 illustrate a second embodiment for practicing the invention.
Figure 13:
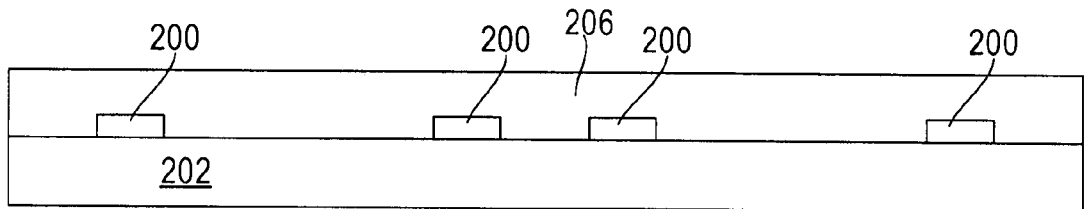
Figure 14:
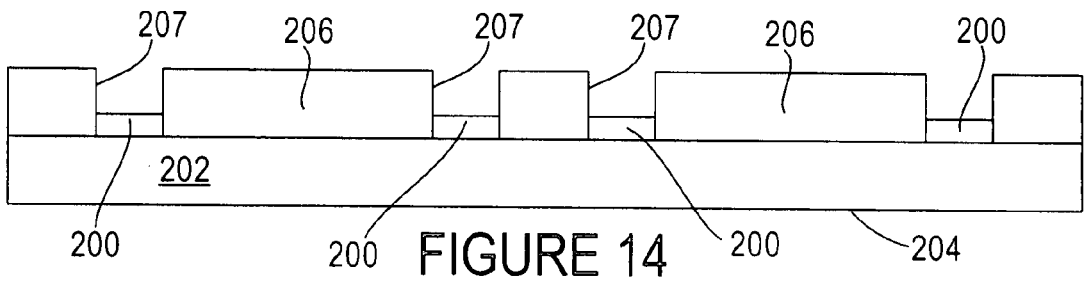
Figure 15:
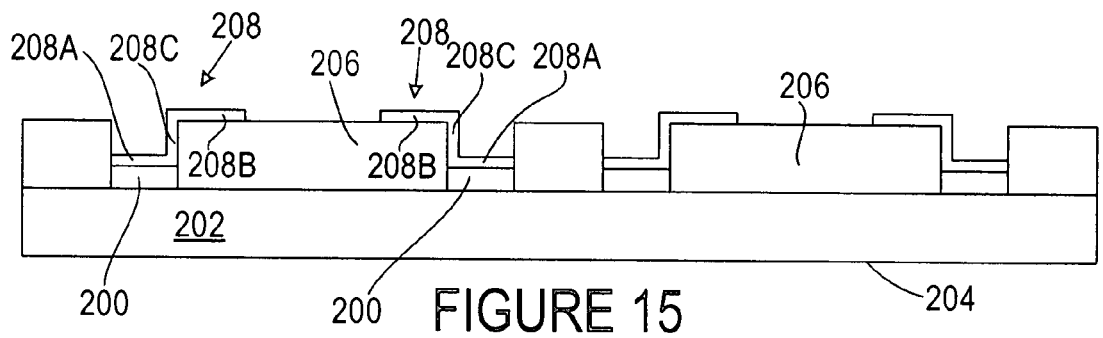
Figure 16:
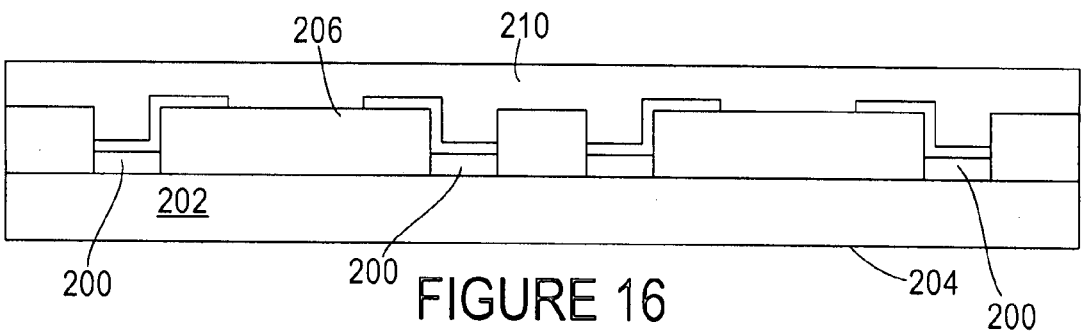
Figure 17:
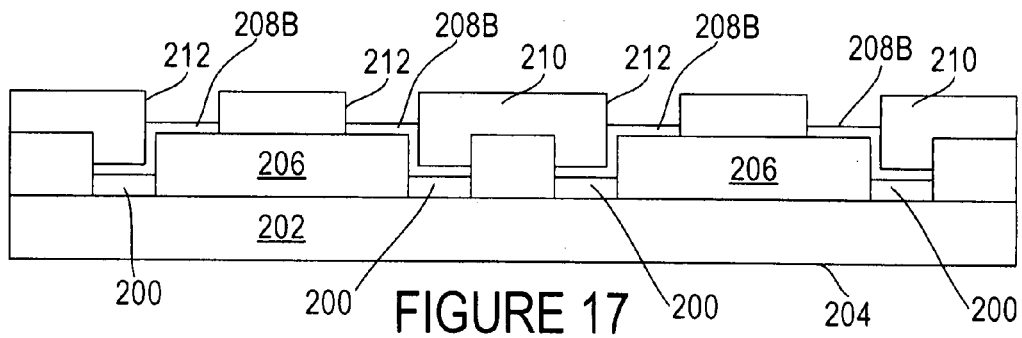

FIGS. 12-19 illustrate a second embodiment of the invention. FIG. 12 illustrates a structure similar to that shown in FIG. 4, with flat metal bodies 200 formed by means of plating on the die (one shown at 202) of the wafer 204 for functional contact with the circuitry of each die. Next (FIG. 13), a dielectric layer 206 is deposited over that structure and, using photolithographic techniques, openings 207 are etched in the dielectric layer 206 to expose the bodies 200. Then, a metal layer is deposited on the resulting structure and is etched to define stepped metal bodies 208, each of which has a flat portion 208A on a body 200, a flat portion on and overlying 208B the dielectric layer 206, and a portion 208C interconnecting the portions 208A, 208B (FIG. 15).

Figure 18:
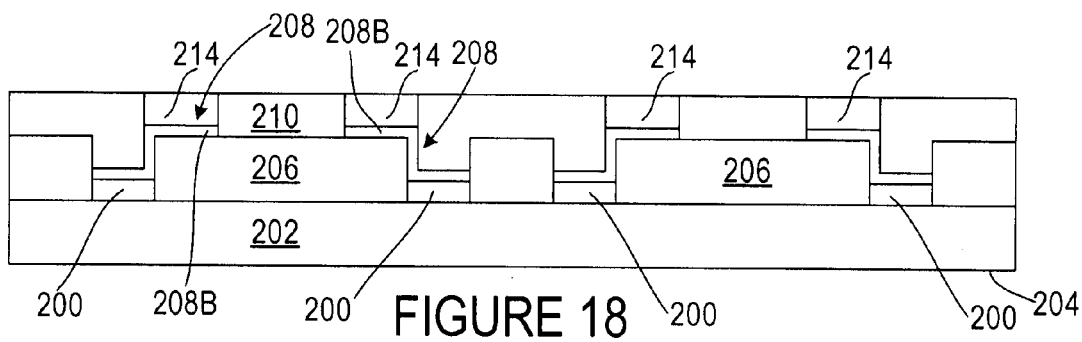
Figure 19:
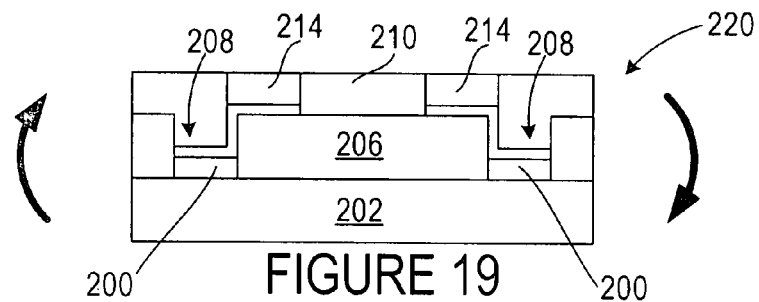

Another dielectric layer 210 is deposited over the resulting structure (FIG. 16) and, using photolithographic techniques, openings 212 are etched in the dielectric layer 210 to expose the portions 208B. A metal plating step is undertaken to fill these openings 212, to provide flat contacts 214 on the portions (FIG. 18). The stepped metal bodies 208 and flat metal bodies 200 provide connection between the contacts 214 and the die (for example die 202). The wafer is then sawed into individual units, each including a die (one unit 220 including die 202 shown in FIG. 19). The units 200 which include die that failed the wafer probe test are discarded.

Figure 20:
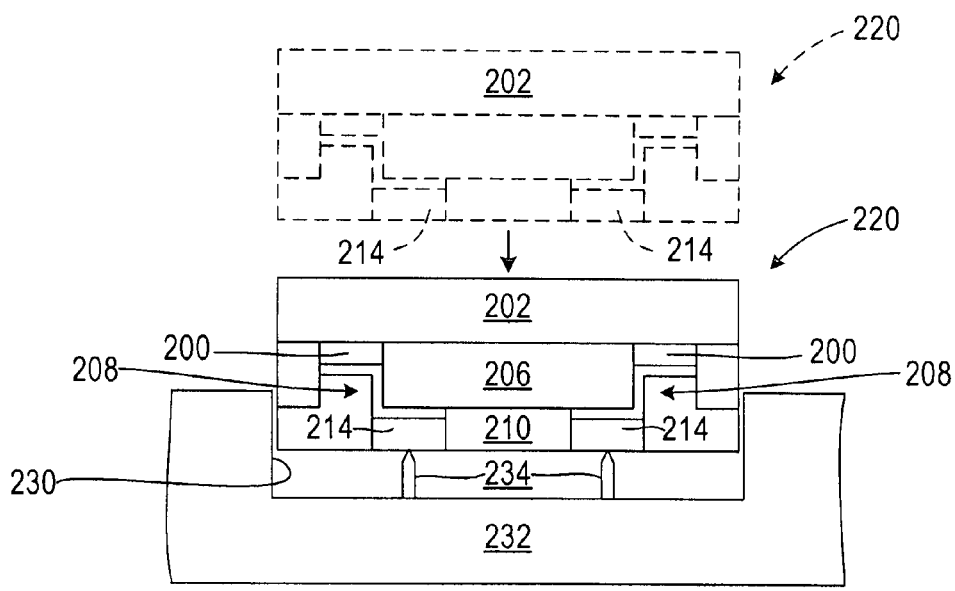

The unit 220 including the individual, unenclosed die 202 is flipped over (FIG. 19), so that the contacts 214 are now are downwardly positioned. The unit 220 can then be placed into the test socket 230 of a testing device 232, and clamped down therein, with the contacts 214 in direct contact with test probes 234 in the test socket 230 of the testing device 232 (FIG. 20). Full functional testing can then be done on the unenclosed die 202 with the unit 220 inserted in the test socket 230, a much more complete form of testing than the probe testing of the die 202 undertaken with the die 202 as part of the wafer. Similar to the previous embodiment, this results in a much higher yield in a device including multiple die, because each die undergoes socket testing as described above.

FIG. 21 illustrates a system 300 utilizing devices constructed as described above. As shown therein, the system 300 includes hand-held devices 302 in the form of cell phones, which communicate through an intermediate apparatus such as a tower 304 (shown) and/or a satellite. Signals are provided from one cell phone to the other through the tower 304. Such a cell phone with advantage uses devices of the type described above. One skilled in the art will readily understand the advantage of using such devices in other hand-held devices 302 such as portable media players, personal digital assistants, digital cameras and the like.

FIG. 22 illustrates another system 400 utilizing devices as described above. The system 400 includes a vehicle 402 having an engine 404 controlled by an electronic control unit 406. The electronic control unit 406 with advantage uses devices of the type described.

Figure 23:
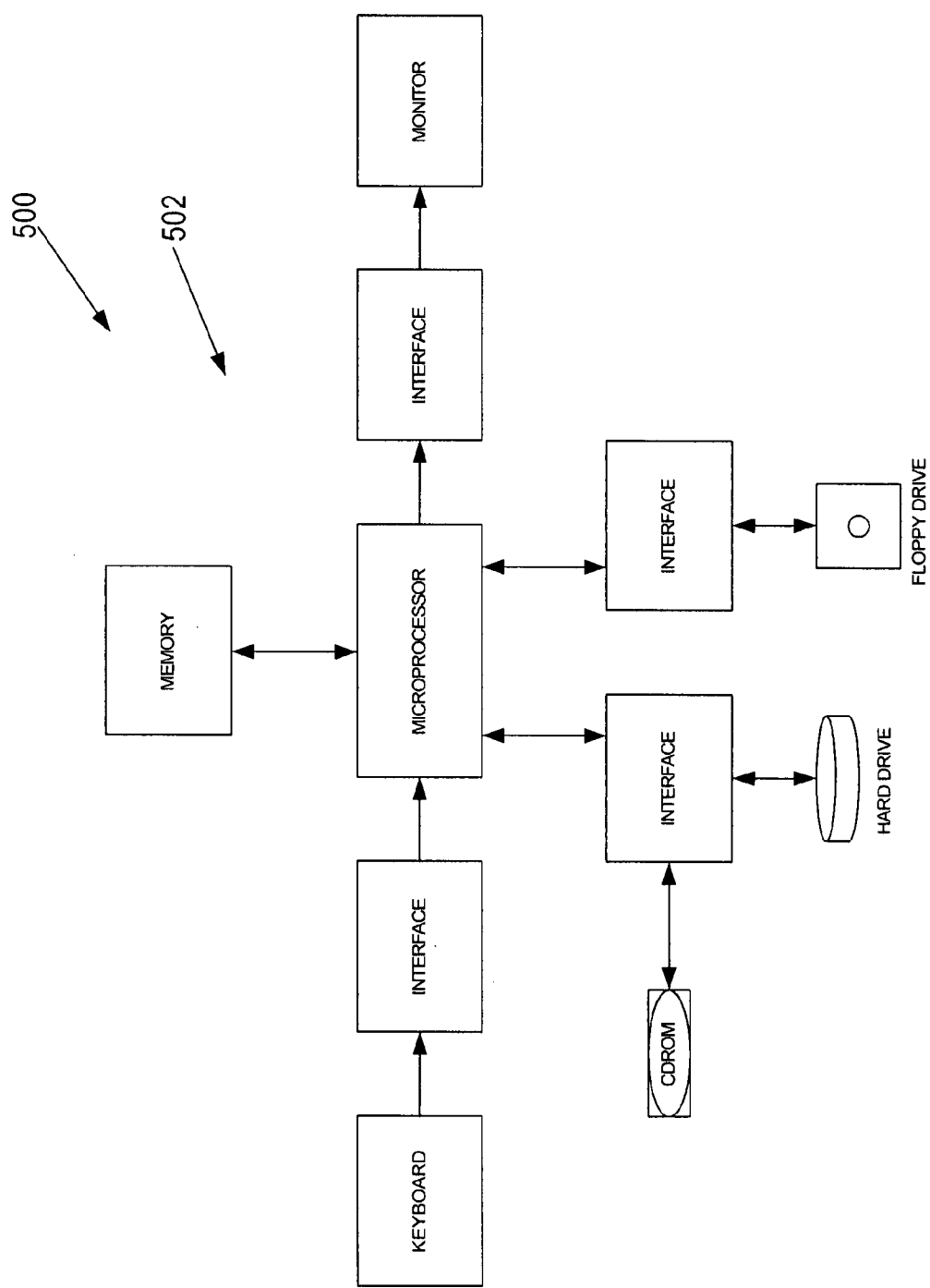

FIG. 23 illustrates yet another system 500 utilizing devices as described above. This system 500 is a computer 502 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. Systems of this type with advantage use devices of the type.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of constructing a multi-die semiconductor device comprising:
    providing an unenclosed first semiconductor die;
    providing flat metal contacts having parallel sides and parallel top and bottom surfaces on the unenclosed first semiconductor die that extend through mold compound wherein the surfaces of the flat metal contacts lie in the same plane as the surfaces of the mold compound;
    testing the unenclosed first semiconductor die in a test socket, with the flat metal contacts on the unenclosed first semiconductor die in contact with test probes of the test socket; and
    providing the first semiconductor die in a package including at least a second semiconductor die in stacked relation with the first semiconductor die.

2. The method of claim 1 wherein the flat metal contacts are provided when the first semiconductor die is part of a wafer.

3. The method of claim 1 and further comprising probe testing the first semiconductor die when the first semiconductor die is part of a wafer.

4. A method of constructing a multi-die semiconductor device comprising:
    providing a first semiconductor die;
    providing flat metal contacts having parallel sides and parallel top and bottom surfaces connected to the first semiconductor die that extend through mold compound wherein the surfaces of the flat metal contacts lie in the same plane as the surface of the mold compound;
    testing the first semiconductor die in a test socket, using the flat metal contacts connected to the first semiconductor die;
    providing a second semiconductor die;
    providing contacts connected to the second semiconductor die;
    testing the second semiconductor die in a test socket using the flat metal contacts connected to the second semiconductor die; and
    providing the first semiconductor die and second semiconductor die in stacked relation in a package.

5. The method of claim 4 wherein the flat metal contacts connected to the first semiconductor die are provided when the first semiconductor die is part of a wafer, and wherein the flat metal contacts connected to the second semiconductor die are provided when the second semiconductor die is part of a wafer.

6. The method of claim 5 wherein the flat metal contacts connected to the first and second semiconductor die are substantially flat contacts.

7. A method of constructing a multi-die semiconductor device comprising:
    providing an unenclosed first semiconductor die which has been probe-tested as part of a wafer;
    providing an unenclosed second semiconductor die which has been probe-tested as part of a wafer;
    providing flat metal contacts having parallel sides and parallel top and bottom surfaces connected to the unenclosed first semiconductor die that extend through mold compound and flat metal contacts connected to the unenclosed second semiconductor die that extend through mold compound wherein the surfaces of the flat metal contacts lie in the same plane as the surfaces of the mold compound;
    testing the unenclosed first semiconductor die in a test socket, using the flat metal contacts connected to the unenclosed first semiconductor die;
    testing the unenclosed second semiconductor die in a test socket, using the flat metal contacts connected to the unenclosed second semiconductor die; and
    providing the first semiconductor die and second semiconductor die in stacked relation in a package.

8. The method of claim 7 wherein the flat metal contacts connected to the first semiconductor die are provided when the first semiconductor die is part of a wafer, and wherein the flat metal contacts connected to the second semiconductor die are provided when the second semiconductor die is part of a wafer.

9. The method of claim 7 wherein the flat metal contacts connected to the first semiconductor die are substantially flat contacts on the first semiconductor die.

10. The method of claim 7 wherein the flat metal contacts are substantially flat contacts connected to the first semiconductor die by connecting members.

11. The method of claim 1 and further comprising said semiconductor device incorporated in a system.

12. The method of claim 11 wherein the system is selected from the group consisting of a hand-held device, a vehicle, and a computer.

13. A method of constructing a semiconductor device comprising:
    providing an unenclosed semiconductor die;
    providing flat metal contacts having parallel sides and parallel top and bottom surfaces on the unenclosed semiconductor die that extend through mold compound wherein the surfaces of the flat metal contacts lie in the same plane as the surface of the mold compound; and
    testing the unenclosed semiconductor die in a test socket, with the flat metal contacts on the unenclosed semiconductor die in contact with test probes of the test socket.

14. The method of claim 13 wherein the flat metal contacts are provided when the semiconductor die is part of a wafer.

* * * * *